United States Patent
Wu et al.

(10) Patent No.: US 10,684,122 B2
(45) Date of Patent: Jun. 16, 2020

(54) COMPLEMENTARY METAL-OXIDE-SEMICONDUCTOR DEPTH SENSOR ELEMENT

(71) Applicant: EMINENT ELECTRONIC TECHNOLOGY CORP. LTD., Hsinchu (TW)

(72) Inventors: Kao-Pin Wu, New Taipei (TW); Tom Chang, Taipei (TW)

(73) Assignee: EMINENT ELECTRONIC TECHNOLOGY CORP. LTD., Hsinchu (TW)

( * ) Notice: Subject to any disclaimer, the term of this patent is extended or adjusted under 35 U.S.C. 154(b) by 16 days.

(21) Appl. No.: 16/225,449

(22) Filed: Dec. 19, 2018

(65) Prior Publication Data
US 2020/0025556 A1 Jan. 23, 2020

(30) Foreign Application Priority Data
Jul. 19, 2018 (TW) .............................. 107125015 A (51) Int. Cl.
*G01B 11/22* (2006.01)
*H01L 27/14* (2006.01)
*H01L 27/146* (2006.01)

(52) U.S. Cl.
CPC .......... *G01B 11/22* (2013.01); *H01L 27/1461* (2013.01); *H01L 27/14614* (2013.01); *H01L 27/14643* (2013.01)

(58) Field of Classification Search
CPC .............. G01B 11/22; H01L 27/14614; H01L 27/1461; H01L 27/14643; H01L 27/1443

USPC .................... 250/559.19, 559.21; 257/215
See application file for complete search history.

(56) References Cited

U.S. PATENT DOCUMENTS

| | | | |
|---|---|---|---|
| 6,486,503 B1 * | 11/2002 | Fossum ................ | G11C 19/282 257/215 |
| 7,352,454 B2 | 4/2008 | Bamji et al. | |
| 7,626,685 B2 | 12/2009 | Jin et al. | |
| 8,513,709 B2 * | 8/2013 | Jin .................... | H01L 27/14609 257/215 |
| 9,859,313 B2 | 1/2018 | Chang et al. | |

FOREIGN PATENT DOCUMENTS

| CN | 101545771 A | 9/2009 |
|---|---|---|
| CN | 102449766 A | 5/2012 |

(Continued)

*Primary Examiner* — Seung C Sohn
(74) *Attorney, Agent, or Firm* — Patenttm.us; James Walters (57) ABSTRACT

A complementary metal-oxide-semiconductor depth sensor element having a photogate formed in a photosensitive area on a substrate. A first transfer gate and a second transfer gate are formed respectively on two sides of the photogate in intervals. A first floating doped area and a second floating doped area are formed respectively on the outer sides of the first transfer gate and the second transfer gate. A semiconductor area is formed on the substrate. A lightly doped region is formed on the semiconductor area. The photogate, the first and second transfer gates and the first and second floating doped area are commonly formed on the lightly doped region. With the lightly doped region, the linear performance that the majority carriers move in the photogate is also affected to achieve the purpose for increasing the reaction rate.

13 Claims, 7 Drawing Sheets

(56) References Cited

FOREIGN PATENT DOCUMENTS

| EP | 1846948 A2 | 10/2007 |
|----|------------|---------|
| TW | 201616218 A | 5/2016 |
| TW | 201711175 A | 3/2017 |
| WO | 2006/086281 A1 | 8/2006 |

* cited by examiner

COMPLEMENTARY METAL-OXIDE-SEMICONDUCTOR DEPTH SENSOR ELEMENT

CROSS-REFERENCE TO RELATED APPLICATIONS

This application is based upon and claims priority under 35 U.S.C. 119 from Taiwan Patent Application No. 107125015 filed on Jul. 19, 2018, which is hereby specifically incorporated herein by this reference thereto.

BACKGROUND OF THE INVENTION

1. Field of the Invention

The present invention relates to a depth sensor element, especially to a complementary metal-oxide-semiconductor (CMOS) depth sensor element.

2. Description of the Prior Arts

With the advancement of technology, electronic devices are changing with each passing day. The input methods for electronic devices are also improving. From the traditional physical button to the virtual touch panel, the recent development of the input methods is a non-contact input. The user does not need to touch the electronic device, the electronic device detects the user through the non-contact sensor. The gestures that are operated in the air are identified and the corresponding instructions are executed. Especially for devices with Augmented Reality (AR) functionality, the use of contactless inputs makes the input more intuitive and more convenient to use.

For the non-contact input, a conventional depth sensor element can be used for sensing in the prior art. However, in the semiconductor structure of the conventional depth sensor element in the prior art, the transmission speed of majority carriers is slow. Therefore, the semiconductor structure of the conventional depth sensor element is not conducive to the development of high-speed image sensors.

To overcome the shortcomings, the present invention provides a depth sensor element to mitigate or to obviate the aforementioned problems.

SUMMARY OF THE INVENTION

Therefore, the present invention modifies the conventional depth sensor element to provide quicker sensing reaction rate.

To achieve the aforementioned purpose, the present invention provides a depth sensor element comprising:
  a substrate comprising a photosensitive region;
  a semiconductor region formed on the substrate;
  a photogate formed on the semiconductor region, corresponding to the photosensitive region and having a first side and a second side;
  a first transfer gate formed on the semiconductor region and having
    a first side; and
    a second side adjacent to the first side of the photogate;
  a first gap formed between the second side of the first transfer gate and the first side of the photogate;
  a second transfer gate formed on the semiconductor region and having
    a first side adjacent to the second side of the photogate; and
    a second side;
  a second gap formed between the first side of the second transfer gate and the second side of the photogate;
  a lightly doped region formed on the semiconductor region, corresponding to the photosensitive region and being below the first and second transfer gates;
  a first floating doped region formed in the lightly doped region, connected to the first side of the first transfer gate and being as a first transmitting node; and
  a second floating doped region formed in the lightly doped region, connected to the second side of the second transfer gate and being as a second transmitting node;
  wherein the photogate, the first transfer gate, and the second transfer gate commonly connect to the same lightly doped region, and a polarity of dopants of the lightly doped region is the same with a polarities of dopants of the first and second floating doped regions, and the polarity of dopants of the lightly doped region is different to a polarity of dopants of the semiconductor region.

The present invention has following advantages. With the lightly doped region, the depth of the majority carriers in the surface is effected by the lightly doped region when the driving signal is supplied. Then the linear performance that the majority carriers move in the photogate is also affected to achieve the purpose for increasing the moving speed of the majority carriers. Thus, the outputting speed of the sensing signal is also accelerated.

Other objectives, advantages and novel features of the invention will become more apparent from the following detailed description when taken in conjunction with the accompanying drawings.

DETAILED DESCRIPTION OF THE EMBODIMENTS

Figure 1:
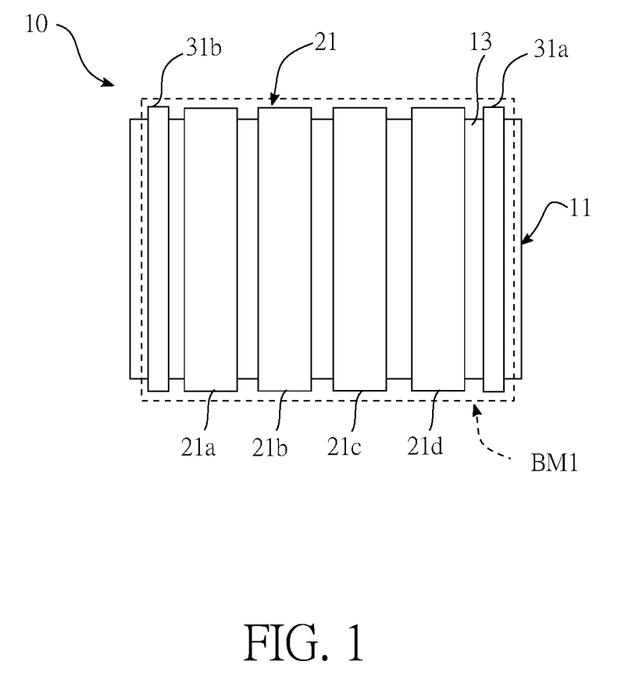
FIG. 1 is a top view of a first embodiment of a depth sensor element in accordance with the present invention.
Figure 2A:
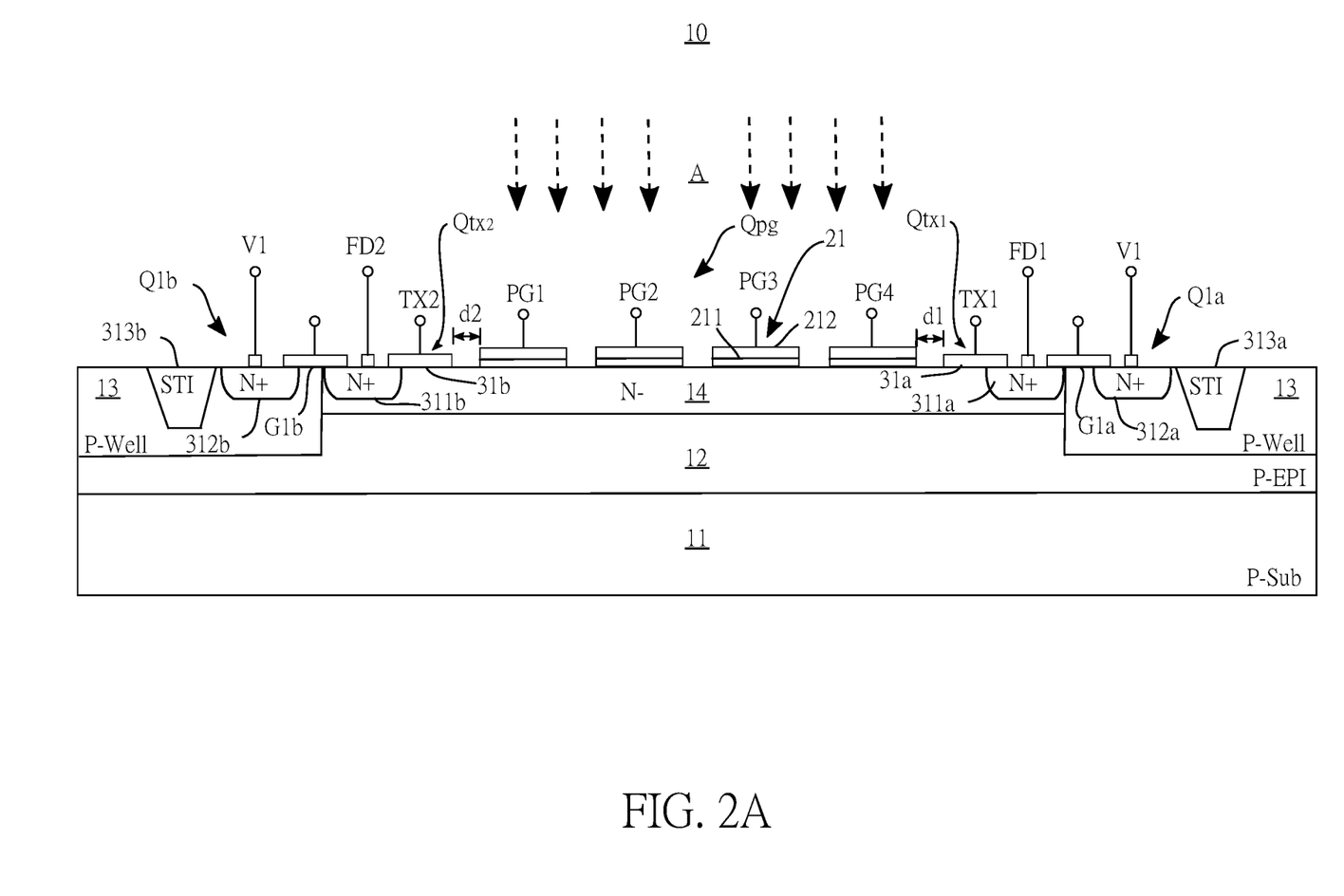
FIG. 2A is a side view in partial section of the depth sensor element in FIG. 1.
Figure 3:
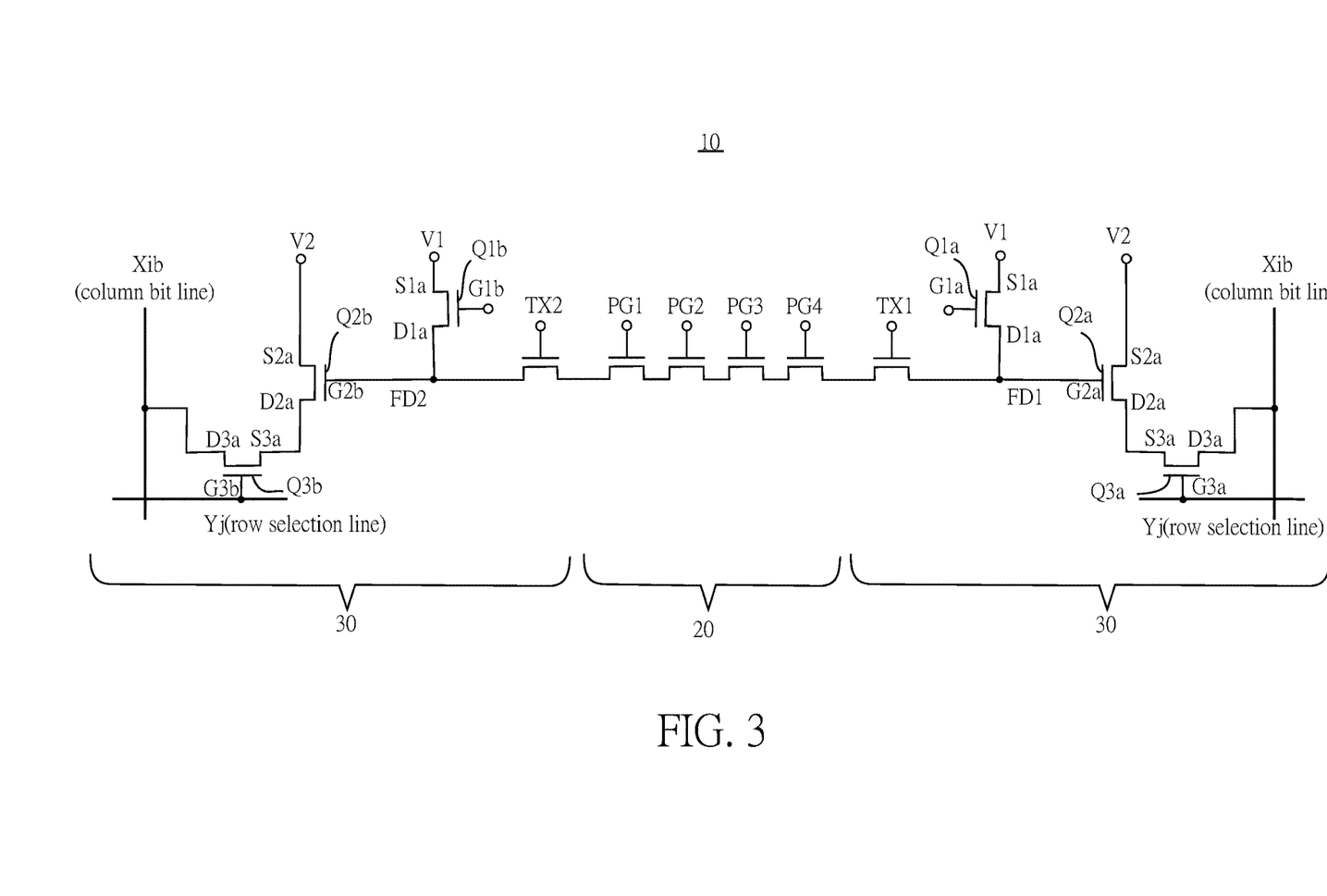
FIG. 3 is a circuit diagram of the depth sensor elements in FIGS. 1 and 2B.

With reference to FIGS. 1A, 2A and 3, a first embodiment of a CMOS depth sensor element 10 in accordance with the present invention comprises a sensing element 20 and a reading unit 30. The sensing element 20 comprises a photogate element Qpg. The reading unit 30 comprises a first transfer transistor Qtx1 and a second transfer transistor Qtx2. The sensing element 20 and the reading unit 30 are formed on a substrate 11 and their semiconductor structures are described in detail as following.

The semiconductor structure of the photogate element Qpg comprises a first semiconductor region 12 formed on the substrate 11. A second semiconductor region 13 is formed on the first semiconductor region 12. When the second semiconductor region 13 is formed, a shielding mask BM1 is used, i.e. the second semiconductor region 13 is formed on the first semiconductor region corresponding to the part that is blocked by the shielding mask BM1. Then a lightly doped region 14 is formed on the first semiconductor area 12. When the lightly doped region 14 is formed, the shielding mask BM1 is also used to block the second semiconductor region 13. Thus, the positions of the second semiconductor region 13 and the lightly doped region 14 do not overlap. The polarity of dopants of the first semiconductor region 12 is the same with the polarity of dopants of the second semiconductor region 13. The polarity of dopants of the lightly doped region 14 is different to the polarity of dopants of the first semiconductor region 12. In one embodiment, the doping concentration of the dopants of the lightly area 14 is in the range of about $1 \times 10^{11}$ atoms/cm$^2$ to $10 \times 10^{11}$ atoms/cm$^2$.

Corresponding to a photosensitive region A, an insulating layer 211 is formed on the lightly doped region 14. A poly-silicon layer 212 is formed on the insulating layer 211. The insulating layer 211 and the poly-silicon layer 212 constitute a photogate 21 of the photogate element Qpg. The photogate 21 generates majority carriers when the photogate 21 is excited by light. For n-type photogate element, the majority carriers are electrons. For p-type photogate element, the majority carriers are electron holes. In one embodiment, the photogate 21 comprises multiple sub-photogates 21a~21d arranged in parallel. The amount of the sub-photogates 21a~21d is not limited and the areas of the sub-photogates 21a~21d may be the same or different.

Figure 2B:
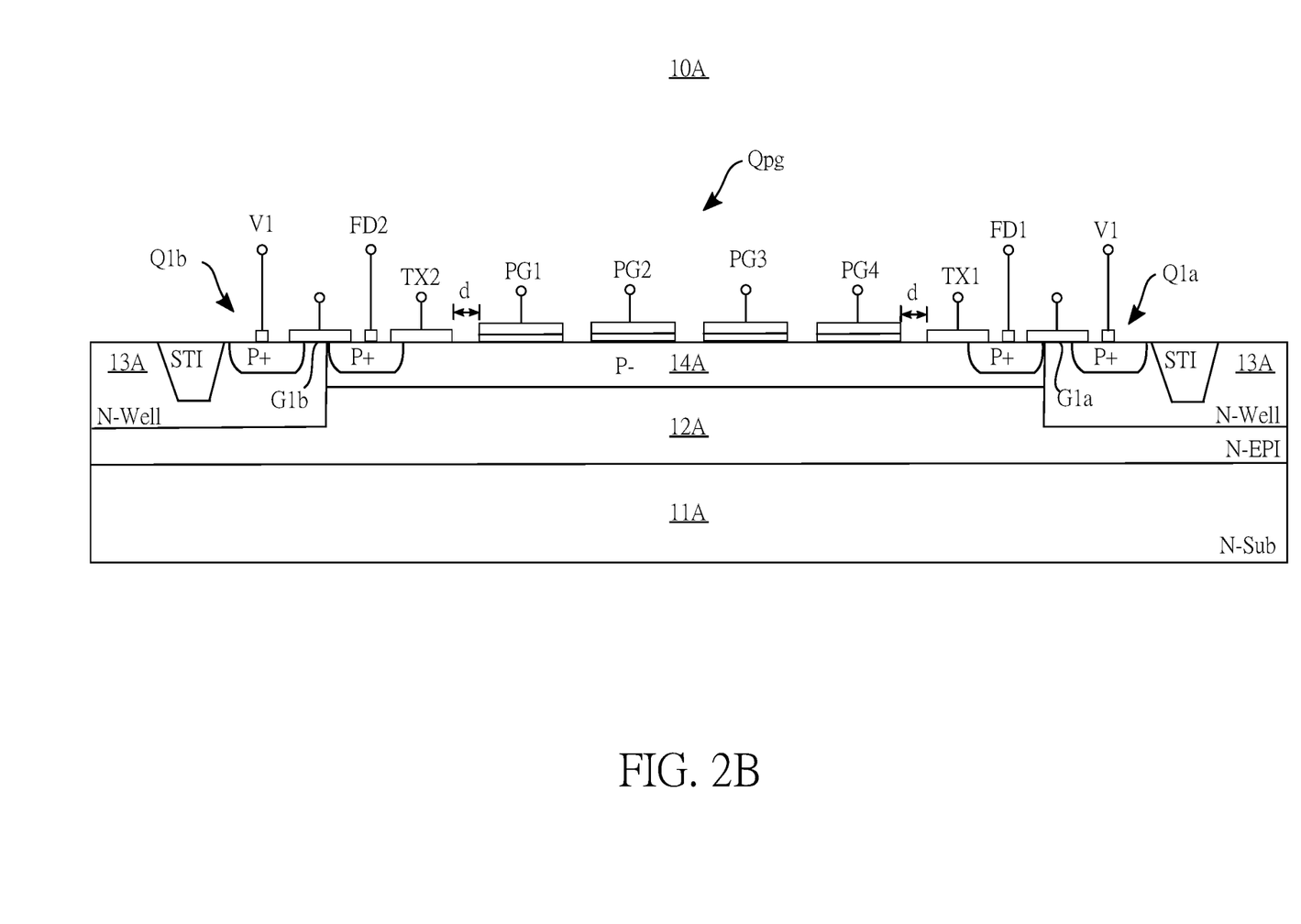
FIG. 2B is a side view in partial section of a depth sensor element in accordance with the present invention.

The semiconductor structure of the first transfer transistor Qtx1 comprises a first transfer gate 31a. The semiconductor structure of the second transfer transistor Qtx2 comprises a second transfer gate 31b. The first and second transfer gates 31a, 31b are formed on the lightly doped region 14. The first transfer gate 31a has a first side and a second side opposite to the first side. The second transfer gate 31b has a first side and a second side opposite to the first side. The second side of the first transfer gate 31a is adjacent to a first side of the photogate 21 of the photogate element Qpg at an interval so that a first gap d1 is formed between the second side of the first transfer gate 31a and the first side of the photogate 21 of the photogate element Qpg. The first side of the second transfer gate 31b is adjacent to a second side of the photogate 21 of the photogate element Qpg at an interval so that a second gap d2 is formed between the first side of the second transfer gate 31b and the second side of the photogate 21 of the photogate element Qpg. In one embodiment, the first gap d1 is equal to the second gap d2. A first floating doped region 311a and a second floating doped region 311b are respectively used as a first transmitting node FD1 and a second transmitting node FD2 and are formed in the lightly doped region 14. The first floating doped region 311a corresponds to and is connected to the first side of the first transfer gate 31a. The second floating doped region 311b corresponds to and is connected to the second side of the second transfer gate 31b. The polarities of dopants of first and second floating doped regions 311a, 311b are the same with the polarity of dopants of the lightly doped are 14. In one embodiment as shown in FIG. 2A, the substrate 11 is a p-type substrate (P-Sub). The first semiconductor region 12 is a p-type epitaxy (P-EPI). The second semiconductor region 13 is a p-type doped well (P-Well). The lightly doped region 14 is a n$^-$ doped region. The first and second floating doped regions 311a, 311b are n$^+$ doped regions. In another embodiment as shown in FIG. 2B, the substrate 11A is a n-type substrate (N-Sub). The first semiconductor region 12A is a n-type epitaxy (N-EPI). The second semiconductor region 13A is a n-type doped well (N-Well). The lightly doped region 14A is a p$^-$ doped region. The first and second floating doped regions 311a, 311b are p$^+$ doped regions.

Therefore, the photogate 21 and the first and second transfer gates 31a, 31b are commonly formed on the lightly doped region 14.

In one embodiment, the reading unit 30 may further comprise a first and a second reset transistors Q1a, Q1b, a first and a second amplifier transistors Q2a, Q2b and a first and a second selection transistors Q3a, Q3b. In this embodiment, those transistors are n-type metal-oxide-semiconductor field-effect transistors (NMOSFETs) and are represented in electronic element symbols. The sources S1a, S1b of the first and second reset transistors Q1a, Q1b are respectively connected to the first and second transmitting nodes FD1, FD2. The drains D1a, D1b of the first and second reset transistors Q1a, Q1b are connected to a first high potential voltage V1. The gates G2a, G2b of the first and second amplifier transistors Q2a, Q2b are respectively connected to the first and second transmitting nodes FD1, FD2. The drains D2a, D2b of the first and second amplifier transistors Q2a, Q2b are connected to a second high potential voltage V2. The sources S2a, S2b of the first and second amplifier transistors Q2a, Q2b are connected to the drains D3a, D3b of the first and second selection transistors Q3a, Q3b. The gates G3a, G3b of the first and second selection transistors Q3a, Q3b are connected to a corresponding row selection line Yj. The sources S3a, S3b of the first and second selection transistors Q3a, Q3b are respectively connected to corresponding column bit lines Xia, Xib. The electric potentials of the first high potential voltage V1 and the second high potential voltage V2 may be different or the same.

In one embodiment, a first and second drain/source doped regions 312a, 312b of the first and second reset transistors Q1a, Q1b are formed in the p-type doped well. A first and second gates G1a, G1b are formed on the p-type doped well. Two sides of the first gate G1a are respectively connected to the first floating doped region 311a and the first drain-source doped region 312a. Two sides of the second gate G1b are respectively connected to the second floating doped region 311b and the second drain/source doped region 312b. A first and second trench isolating regions 313a, 313b are formed in the p-type doped well and respectively adjacent to another side of the first and second drain/source doped regions 312a, 312b. The polarities of dopants of the first and second drain/source doped regions 312a, 312b are different to that of the second semiconductor region 12.

Figure 4:
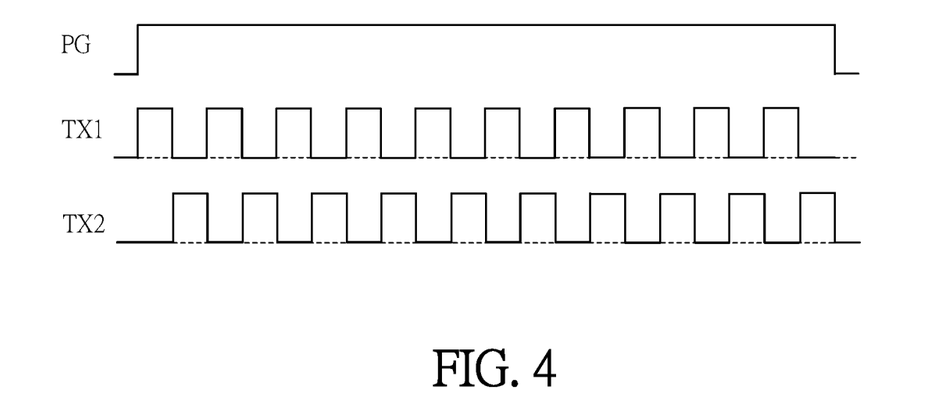
FIG. 4 is a time sequence diagram of the signals in the depth sensor elements in FIG. 3.

When the sensing signals of the photogate element Qpg are read as shown in FIG. 4, a high electric potential signal PG is supplied to the photogate 21 and a first and second driving signals TX1, TX2 (square wave) are respectively supplied to the first and second transfer gates 31a, 31b of the first and second transfer transistors Qtx1, Qtx2. Since the first driving signal TX1 is a reverse signal of the second driving signal TX2, the electric fields are respectively established between the photogate 21 and the first or second transfer gates 31a, 31b. By the fringing electric field effect, the majority carriers of the generated from the photogate 21 excited by the lights are transferred to the first or second floating doped regions 311a, 311b to accelerate the outputting speed of the sensing signals. For a part of the high electric potential signal PG corresponds to the first transfer gate 311a that is simultaneously at high electric potential so that the majority carriers are transferred to the first transmitting node FD1. At this time, the gate G1a of the first reset transistor Q1a is not switched on due to low electric potential so that the first amplifier transistor Q2a is switched on to amplify the sensing signals corresponding to the majority carriers collected in the first transmitting node FD1. When a selection signal is transmitted to the row selection line Yj connecting to the gate G3a of the first selection transistor Q3a, the first selection transistor Q3a is switched on to transmit the amplified sensing signals to the corresponding column bit line Xia. For another part of the high electric potential signal PG corresponds to the second transfer gate 311b that is simultaneously at high electric potential so that the majority carriers are transferred to the second transmitting node FD2. At that time, the gate G1b of the second reset transistor Q1b is not switched on due to low electric potential so that the second amplifier transistor Q2b is switched on to amplify the sensing signals corresponding to the majority carriers collected in the second transmitting node FD2. When a selection signal is transmitted to the row selection line Yj connecting to the gate G3b of the second selection transistor Q3b, the second selection transistor Q3b is switched on to transmit the amplified sensing signals to the corresponding column bit line Xib.

Figure 5A:
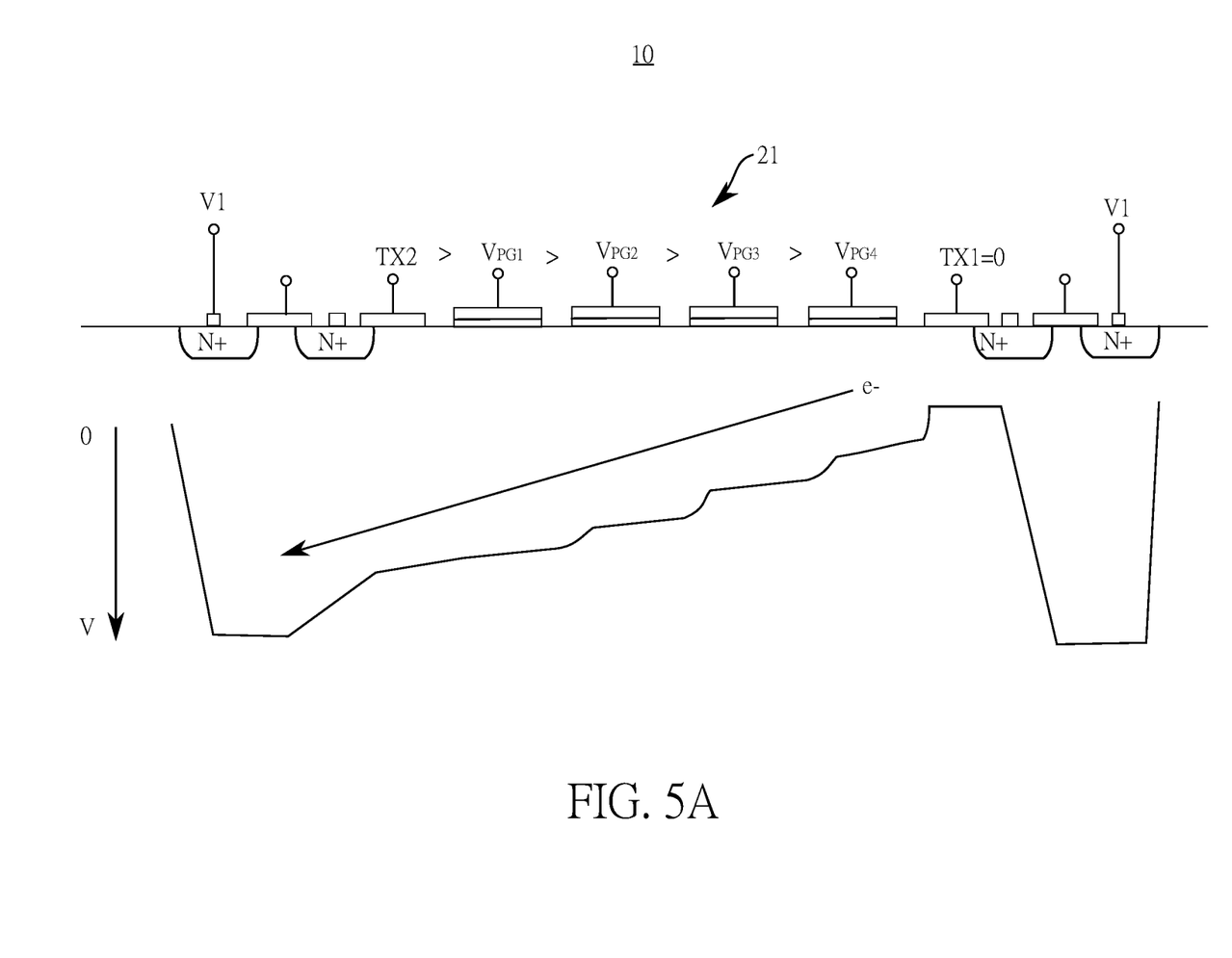
FIG. 5A is an energy level diagram of the potential energy of the depth sensor element in FIG. 1 during the first time phase.

With further reference to FIGS. 3B and 5A, when the sensing signals corresponding to the majority carriers of the first transmitting node FD1 are read at first time phase, the first driving signal TX1 is supplied to the first transfer gate 31a as shown in FIG. 4. At this time, the first transfer gate 31a is at high electric potential. In addition, to speed up the transferring speed of the majority carriers, multiple high electric potential signals with different electric potentials are respectively supplied simultaneously to the sub-photogates 21a~21d. As shown in FIG. 5A, the electric potentials of the high electric potential signals $V_{PG1}$~$V_{PG4}$ are gradually decreased from the first transfer gate 31a toward the second transfer gate 31b. The electric potential of the first driving signal TX1 is higher than the high electric potential signals $V_{PG1}$~$V_{PG4}$. At the same time, the second driving signal TX2 is not supplied to the second transfer gate 31b so that the electric potential of the second transfer gate 31b is zero.

Figure 5B:
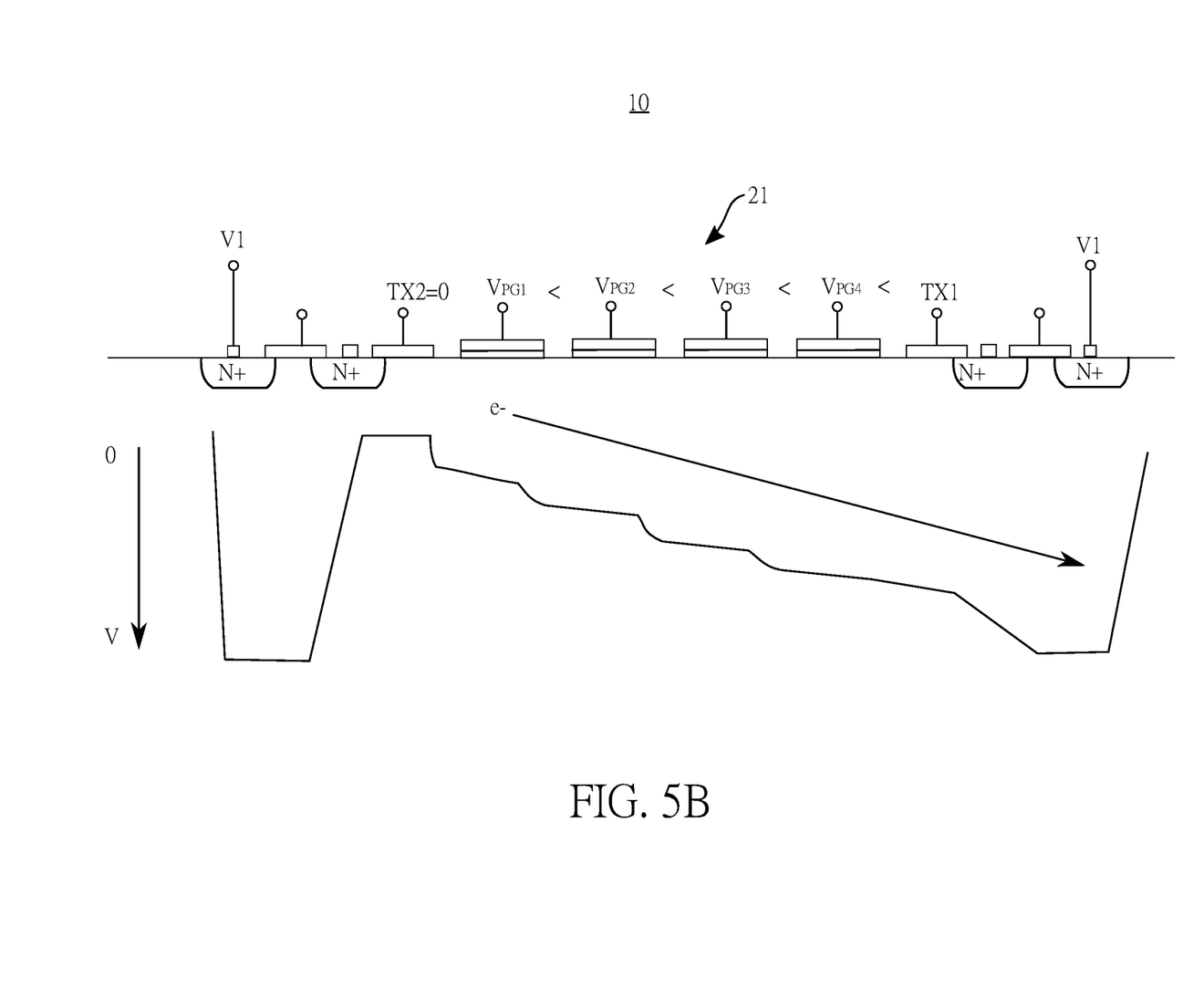
FIG. 5B is an energy level diagram of the potential energy of the depth sensor element in FIG. 1 during the second time phase.

With further reference to FIGS. 3B and 5B, when the sensing signals corresponding to the majority carriers of the second transmitting node FD2 are read at second time phase, the second driving signal TX2 is supplied to the second transfer gate 31b as shown in FIG. 4. At this time, the second transfer gate 31b is at high electric potential. In addition, the multiple high electric potential signals with different electric potentials are respectively supplied simultaneously to the sub-photogates 21a~212d. The electric potentials of the high electric potential signals $V_{PG1}$~$V_{PG4}$ are gradually increased from the first transfer gate 31a toward the second transfer gate 31b. The electric potential of the second driving signal TX2 is higher than the high electric potential signals $V_{PG1}$~$V_{PG4}$. At the same time, the first driving signal TX1 is not supplied to the first transfer gate 31a so that the electric potential of the first transfer gate 31a is zero.

The gaps d1, d2 must be sufficient to establish electric fields for forming the fringing electric field effect between the photogate 21 and the first or second transfer gates 311a, 311b when the first and second driving signals TX1, TX2 are at high electric potential. In one embodiment, each gap d1, d2 is 0.22 micrometer. If the highest supplied voltage to the photogate 21 is 3.3V, each gap d1, d2 may be between 0.01 to 0.22 micrometer, but is not limited to that. Further, when the voltage supplied to the photogate 21 is higher, each gap may be larger, such as 0.01 to 0.4 micrometer.

With the aforementioned semiconductor structure of the CMOS depth sensor element, the depth of the majority carriers in the surface is effected by the lightly doped region 14 when the driving signal is supplied. Then the linear performance that the majority carriers move in the photogate 21 is also affected to achieve the purpose for increasing the moving speed of the majority carriers. Thus, the outputting speed of the sensing signal is also accelerated. In addition, the first and second floating doped regions 311a, 311b are used as transmitting nodes, and the photogate 21 and the first and the second transfer gates 31a, 31b connect to the same semiconductor regions. When the first or second transfer gates 31a, 31b are supplied the driving signals to read the sensing signals of the CMOS depth sensor element of the present invention, an electric field is established between the photogate 21 and the first or second transfer gates 31a, 31b supplied the driving signals to result in a fringing electric field effect. Then the majority carriers from the photogate element excited by lights drift to the first or second floating doped regions 31a, 31b to speed up the outputting speed of the sensing signals.

Even though numerous characteristics and advantages of the present invention have been set forth in the foregoing description, together with details of the structure and features of the invention, the disclosure is illustrative only. Changes may be made in the details, especially in matters of shape, size, and arrangement of parts within the principles of the invention to the full extent indicated by the broad general meaning of the terms in which the appended claims are expressed.

What is claimed is:

1. A depth sensor element comprising:
   a substrate comprising a photosensitive region;
   a semiconductor region formed on the substrate;
   a photogate formed on the semiconductor region, corresponding to the photosensitive region and having a first side and a second side;
   a first transfer gate formed on the semiconductor region and having
      a first side; and
      a second side adjacent to the first side of the photogate;
   a first gap formed between the second side of the first transfer gate and the first side of the photogate;
   a second transfer gate formed on the semiconductor region and having
      a first side adjacent to the second side of the photogate; and
      a second side;
   a second gap formed between the first side of the second transfer gate and the second side of the photogate;
   a lightly doped region formed on the semiconductor region, corresponding to the photosensitive region and being below the first and second transfer gates;
   a first floating doped region formed in the lightly doped region, connected to the first side of the first transfer gate and being as a first transmitting node; and
   a second floating doped region formed in the lightly doped region, connected to the second side of the second transfer gate and being as a second transmitting node;
   wherein the photogate, the first transfer gate, and the second transfer gate commonly connect to the same lightly doped region, and a polarity of dopants of the lightly doped region is the same with a polarities of dopants of the first and second floating doped regions, and the polarity of dopants of the lightly doped region is different to a polarity of dopants of the semiconductor region.

2. The depth sensor element as claimed in claim 1 further comprising:

a first reset transistor comprising a first gate and a first drain/source doped region, wherein two sides of the first gate are respectively connected to the first floating doped region and the first drain/source doped region;

a second reset transistor comprising a second gate and a second drain/source doped region, wherein two sides of the second gate are respectively connected to the second floating doped region and the second drain/source doped region;

a first trench isolating region, wherein two sides of the first drain/source doped region respectively correspond to the first gate and the first trench isolating region;

a second trench isolating region, wherein two sides of the second drain/source doped region respectively correspond to the second gate and the second trench isolating region;

wherein polarities of dopants of the first and second drain/source doped regions are different to a polarity of dopants of the semiconductor region.

3. The depth sensor element as claimed in claim 2, wherein the semiconductor region is an epitaxy;

a doped well is formed in the epitaxy and corresponds to the first and second gates; and the first and second drain/source doped regions and the first trench isolating region are formed in the doped well.

4. The depth sensor element as claimed in claim 3, wherein the substrate is a p-type substrate;

the epitaxy is a p-type epitaxy;

the doped well is a p-type doped well;

the lightly doped region, the first and second floating doped regions are n-type doped regions; and the first and second drain/source doped regions are n-type doped regions.

5. The depth sensor element as claimed in claim 3, wherein the substrate is a n-type substrate;

the epitaxy is a n-type epitaxy;

the doped well is a n-type doped well;

the lightly doped region, the first and second floating doped regions are p-type doped regions; and the first and second drain/source doped regions are p-type doped regions.

6. The depth sensor element as claimed in claim 2 further comprising:

two amplifier transistors, and each amplifier transistor having a gate, and the two gates of the amplifier transistors respectively coupled to the first and second floating doped regions; and two selection transistors, and each selection transistor coupling to a corresponding amplifier transistor, a column bit line and a row selection line.

7. The depth sensor element as claimed in claim 3 further comprising:

two amplifier transistors, and each amplifier transistor having a gate, and the two gates of the amplifier transistors respectively coupled to the first and second floating doped regions; and two selection transistors, and each selection transistor coupling to a corresponding amplifier transistor, a column bit line and a row selection line.

8. The depth sensor element as claimed in claim 4 further comprising:

two amplifier transistors, and each amplifier transistor having a gate, and the two gates of the amplifier transistors respectively coupled to the first and second floating doped regions; and two selection transistors, and each selection transistor coupling to a corresponding amplifier transistor, a column bit line and a row selection line.

9. The depth sensor element as claimed in claim 5 further comprising:

two amplifier transistors, and each amplifier transistor having a gate, and the two gates of the amplifier transistors respectively coupled to the first and second floating doped regions; and two selection transistors, and each selection transistor coupling to a corresponding amplifier transistor, a column bit line and a row selection line.

10. The depth sensor element as claimed in claim 1, wherein the photogate has multiple sub-photogates arranged in parallel, wherein at a first time phase, from the first transfer gate to the second transfer gate, the first transfer gate and the sub-photogates are supplied descending voltages; and at a second time phase, form the second transfer gate to the first transfer gate, the second transfer gate and the sub-photogates are supplied descending voltages.

11. The depth sensor element as claimed in claim 10, wherein the sub-photogates have the same area.

12. The depth sensor element as claimed in claim 10, wherein the sub-photogates have different areas.

13. The depth sensor element as claimed in claim 1, wherein the first and second gap is between 0.01 micrometer to 0.4 micrometer.

* * * * *